United States Patent [19]

Jones

[11] Patent Number: 4,855,666
[45] Date of Patent: Aug. 8, 1989

[54] AC CURRENT SWITCH

[76] Inventor: Thad M. Jones, 2048 Trailridge North, Mishawaka, Ind. 46544

[21] Appl. No.: 255,964

[22] Filed: Oct. 11, 1988

[51] Int. Cl.$^4$ .................................. H03K 17/687
[52] U.S. Cl. ...................... 323/351; 323/237; 323/320; 307/571; 307/584
[58] Field of Search .......... 323/237, 239, 282, 285, 323/320, 324, 325, 351; 307/239, 571, 583, 584

[56] References Cited

U.S. PATENT DOCUMENTS

| | | | |
|---|---|---|---|
| 3,619,656 | 11/1971 | Domke | 323/237 |
| 4,176,288 | 11/1979 | Komatsu et al. | 323/239 |
| 4,477,742 | 10/1984 | Janutka | 307/571 |
| 4,603,269 | 7/1986 | Hochstein | 307/571 |
| 4,649,302 | 3/1987 | Damiano et al. | 307/584 |
| 4,743,834 | 5/1988 | Rice | 323/239 |

Primary Examiner—Peter S. Wong

[57] ABSTRACT

A current switch which emulates a thyristor by using enhancement mode field effect transistors. A center tapped current transformer and a push-pull field effect transistor arrangement eliminates the need for either rectifier diodes or a full wave bridge connected to the current transformer.

9 Claims, 1 Drawing Sheet

AC CURRENT SWITCH

SUMMARY OF THE INVENTION

This invention relates to current switches and has specific reference to an AC current switch having increased sensitivity.

Heretofore, current switches typically used a threshold current of about 0.5 amps and employed bipolar transistors for switching. One problem associated with the prior current switches using bipolar transistors is that any attempted increase in the threshold sensitivity of the switch results in a temperature rise in the circuit thereby requiring a larger transformer which increases the switch cost and lowers its efficiency.

The current switch of this invention eliminates the problems experienced with bipolar transistor current switches by connecting a pair of mode enhancement field effect transistors so as to emulate a thyristor thereby increasing switch sensitivity without an excessive temperature increase. Further, by implementing a center tapped transformer with a push-pull field effect transistor configuration, the need for either rectifier diodes or a full wave bridge rectifier is eliminated, thereby reducing the number of switch parts.

Accordingly, it is an object of this invention to provide for a current switch having an increased sensitivity.

Another object of this invention is to provide for a current switch having a reduced part count.

Other objects of this invention will become apparent upon a reading of the following description.

DESCRIPTION OF THE PREFERRED EMBODIMENTS

The preferred embodiments herein disclosed are not intended to be exhaustive or to limit the application to the precise forms disclosed. Rather, they are chosen and described so that others skilled in the art may utilize their teachings.

Figure 1:
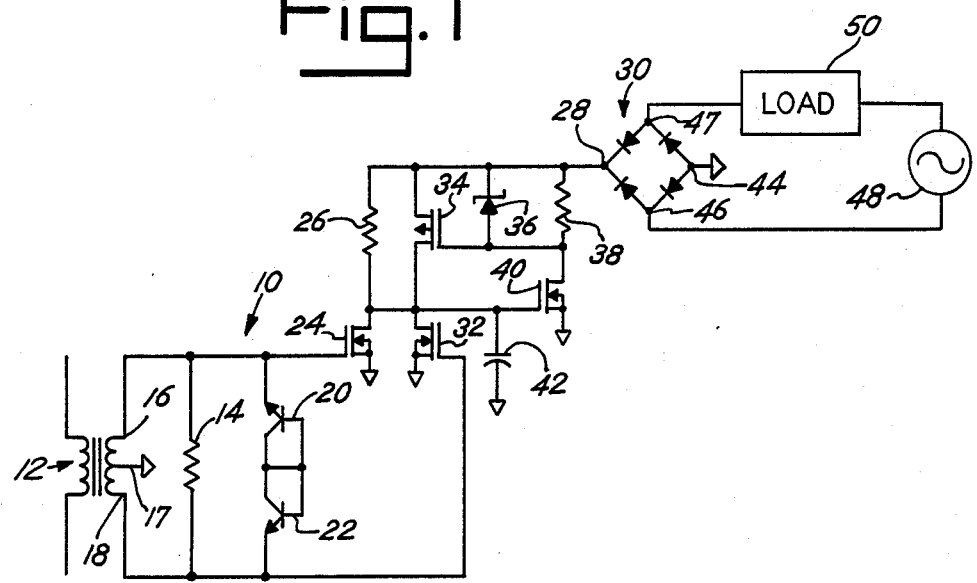
FIG. 1 is a schematical representation of the switch of this invention which has a normally closed configuration.

FIG. 1 illustrates the switch 10 of this invention in a normally closed configuration. Switch 10 includes a center tapped transformer 12 which has a resistor 14 connected across secondary terminals 16 and 18. The transformer secondary center terminal 17 is connected to ground. A pair of NPN transistors 20, 22 having common base and collector leads are connected by their emitter leads across secondary terminals 16 and 18 as illustrated in FIG. 1. The gate of N-channel enhancement mode field effect transistor (FET) 24 is connected to terminal 16 with the source terminal of FET 24 connected to ground. A resistor 26 is connected between the drain terminal of FET 24 and the positive terminal 28 of bridge rectifier 30. The gate of N-channel enhancement mode FET 32 is connected to terminal 18 of the secondary winding of transformer 12. The source terminal of FET 32 is connected to ground. The drain terminal of FET 32 is connected to the source terminal of FET 34 which has its drain terminal connected to the positive terminal 28 of rectifier bridge 30.

A zener diode 36 is connected between the drain and gate terminals of FET 34 with its anode connected to the drain. A resistor 38 is connected across zener diode 36. The drain terminal of FET 40 is connected to the common connection of zener diode 36, resistor 38 and the gate terminal of FET 34. The gate of FET 40 is connected to the source terminals of FETs 24 and 32. A capacitor 42 is connected between the gate of FET 40 and ground.

The negative output terminal 44 of bridge rectifier 30 is connected to ground. Input terminal 46 of rectifier 30 is connected to one side of AC source 48, with the other side of source 48 connected to one side of a load 50. Input terminal 47 of rectifier 30 is connected to the other side of load 50.

It should be understood that the primary winding of transformer 12 is preferably a one turn winding used to sense current flowing through a conductor.

In operation, the current transformer 12 senses the current through a conductor to be monitored, typically ground. Current transformer 12 provides an open circuit voltage which is non-linearly proportional to the current flowing through the primary and the material and geometry of the core. Resistor 14 determines the sensitivity of switch 10 by compensating for variations in the core material of transformer 12 and N-channel FETs 24, 32.

NPN Transistors 20, 22 are included and configured to act as a low leakage current zener diode for the protection of FETs 24, 32 from excessive voltage overload conditions.

Switch 10 of FIG. 1 operates in the following manner. Initially, one must assume that a sinusoidal current is sensed by transformer 12 which causes a transformer secondary voltage peak value less than the threshold voltage of N-channel FETs 24, 32. Further, assume that the bridge rectifier 30 is producing a positive voltage at terminal 28. A charging current flows from terminal 28 through resistor 26 to charge capacitor 42. N-channel FET 40 begins to conduct upon capacitor 42 reaching the FET's threshold voltage. Current through resistor 38, caused by FET 40 conducting, creates a voltage drop across the resistor 38. P-channel FET 34 begins conducting upon the voltage drop across resistor 38 reaching FET's threshold voltage. Upon FET 34 conducting, the charging current of capacitor 42 is increased which further increases the conduction of FET 40. This increase in conduction continues until FET's 34 and 40 reach saturation. Current flow for load 50 is flowing through bridge rectifier 30, zener diode 36 and N-channel FET 40. Zener diode 36 is included to protect the gate of FET 34. Therefore, switch 10 is latched closed to allow current flow through a load such as an indicator lamp.

As current sensed by the primary terminal of transformer 12 rises above the threshold voltages of FETs 24 and 32 (such as upon occurrence of a ground fault condition) the peak value of the transformer's secondary terminals 16, 18 to center tap voltage instantaneously exceeds the threshold voltage of N-channel FET 24 during the positive half cycle and FET 32 during the negative half cycle 32. This causes either FET 24 and 32 to momentarily conduct thereby preventing the charging of capacitor 42. Momentary disruption of the charging current to capacitor 42 prevents it from reaching the threshold voltage of FET 40.

The R-C network of resistor 26 and capacitor 42 causes the gate voltage of FET 24 and FET 32 to lag behind the output voltage of bridge rectifier 30. This effect combined with the momentary disruption of the capacitor's charge current prevents switch 10 from staying closed and the switch 10 is thereby triggered open to prevent current flow through load 50.

Figure 2:
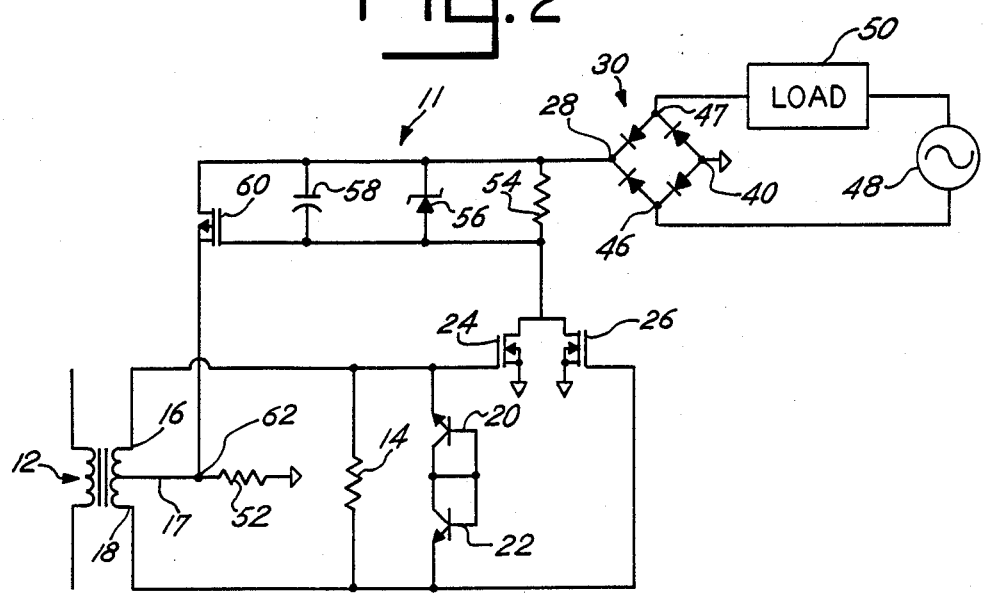
FIG. 2 is a schematical representation of a second embodiment of the switch which has a normally open configuration.

FIG. 2 illustrates a normally open embodiment of switch 10. A common numbering system is employed between FIGS. 1 and 2 wherein like numbered components indicates a similar component and function.

Switch 11 of FIG. 2 includes a transformer 12, resistor 14, transistors 20, 22 and FETs 24 and 30 interconnected identical to switch 10 described above and depicted in FIG. 1. A resistor 52 is connected between transformer secondary terminal 17 and ground. A resistor 54 is connected between the common drain leads of FETs 24, 26 and to terminal 28 of bridge rectifier 30. Zener diode 56 is connected across resistor 54 with its cathode electrically connected to rectifier terminal 28. A capacitor 58 is connected across diode 56 and also across the drain and gate leads of P-channel FET 60. The source lead of FET 60 is connected to junction 62 formed between resistor 52 and transformer secondary terminal 17.

In operation, with the transformer secondary voltage below the threshold voltage of N-channel FETs 24, 26 switch 11 is in its open state and no current is flowing through load 50. Upon the transformer secondary voltage having a peak voltage exceeding the threshold voltage of FET 24 for a positive half cycle and of FET 26 during a negative half cycle the instantaneous gate voltage of FET 24 or FET 26 exceeds its threshold voltage and the FET begins to conduct. Upon conduction of FET 24, (or FET 26 if the transformer secondary voltage is a negative peak value) a current path from source 48 through load 50, rectifier 30 and resistor 54 is established. The voltage drop across resistor 54 created by current through the resistor begins to charge capacitor 58. FET 60 begins to conduct upon the voltage across capacitor 58 reaching the FET 60 threshold voltage. As FET 60 conducts a voltage drop across resistor 52 is created which increases the gate voltage at FET's 24 and 26. This increase in voltage continues until the saturation level of FET's 24 and 26 is attained. The charge stored in capacitor 58 ensures switch conduction during the power line half-cycle.

Normally open switch 10 of FIG. 2 essentially consists of the N-channel FETs 24 and 26, and the P-channel FET 60. In the normally closed embodiment, P-channel FET 60 is replaced by N-channel FET 40 and P-channel FET 34. The voltage drop of switch 11 approximates the voltage of zener diode 56 in the normally open embodiment of FIG. 2 or zener diode 36 in the normally closed embodiment of FIG. 1. Therefore, both embodiments of the switch (10 and 11) depicted above require no external voltage source but merely use a small amount of voltage from the source being monitored.

It should be understood that the invention is not limited to the precise details above but may be monitored within the scope of the appended claims.

I claim:

1. A device for switching a first electrical current flowing in a first conductor responsive to a second electrical current flowing in a second conductor, said device comprising, means for switching said first current, said means having a conductive and nonconductive mode, means connected to said switching means and operatively associated with said second conductor for sensing said second current, means connected to said switching means for latching said switching means in one of said conductive and non-conductive modes, a voltage source connected to said latching means, said sensing means including a transformer having a center tapped secondary winding and a single turn primary winding operatively associated with said second conductor, said switching means including a first field effect transistor (FET) having a gate terminal, a drain terminal, and a source terminal, said gate terminal being connected to said transformer secondary winding, said drain terminal connected to said latching means, said latching means including a second field effect transistor (FET) having a gate terminal, a drain terminal, and a source terminal, said second FET gate terminal being connected to said first FET drain terminal, said latching means further including a capacitive member and a voltage limiting member operatively associated with said second FET, said latching means being electrically connected to said voltage source.

2. The device of claim 1 wherein said latching means includes a third field effect transistor having a gate terminal, a drain terminal and a source terminal, said third FET source terminal being connected to said second FET gate terminal, said second FET drain terminal being connected to said third mentioned gate terminal, said third mentioned drain terminal being connected to said voltage source, said voltage limiting means connected between said third FET drain terminal and said third FET gate terminal wherein said second FET and said third FET are in a mutually biasing relationship.

3. The device of claim 2 wherein said first FET begins conducting and interrupts the mutually biasing relationship of said second and third FETs to switch said device from said conductive mode to said nonconductive mode to interrupt said first current when said second current rises above a threshold level of said first FET.

4. The device of claim 1 wherein said capacitive member and said voltage limiting member are connected in parallel between the drain terminal and gate terminal of said second FET, said second source terminal being connected to a center terminal of said transformer secondary winding.

5. The device of claim 1 wherein said second FET conducts as the first FET begins conducting, whereby said first FET and said second FET are mutually biasing to switch said device from said nonconductive mode to a conductive mode to establish said first current when said second current rises above a threshold level of said first FET.

6. A device for switching a first electrical current flowing in a first conductor responsive to a second electrical current flowing in a second conductor, said device comprising, means for switching said first current, said means having a conductive and nonconductive mode, means connected to said switching means and operatively associated with said second conductor for sensing said second current, means connected to said switching means for latching said switching means in one of said conductive and non-conductive modes, a voltage source connected to said latching means, said sensing means including a transformer having a center tapped secondary winding and a single turn primary winding operatively associated with said second conductor, said switching means including a first field effect transistor (FET) having a gate terminal, a drain terminal, and a source terminal, said gate terminal being connected to said transformer secondary terminal, said drain terminal connected to said latching means, said latching means, including a second field effect transistor (FET) having a gate terminal, a drain terminal and a source terminal, said second FET gate terminal being connected to said first FET drain terminal, said latching means further including a capacitive member and a voltage limiting member operatively associated with said second mentioned FET, said latching means being electrically connected to said voltage source, wherein said latching means includes a third field effect transistor (FET) having a gate terminal, a drain terminal and a source terminal, said third FET source terminal being connected to said second FET gate terminal, said second FET drain terminal being connected to said third mentioned gate terminal, said third FET drain terminal being connected to said voltage source, said voltage limiting means is connected between said third FET drain terminal and said third FET gate terminal wherein said second FET and said third FET are in a mutually biasing relationship.

7. The device of claim 6 wherein said first FET begins conducting and interrupts the mutually biasing relationship of said second and third FETs to switch said device from said conductive when said second current rising above a threshold level of said first FET mode to said non-conductive mode to interrupt said first current.

8. A device for switching a first electrical current flowing in a first conductor responsive to a second electrical current flowing in a second conductor, said device comprising, means for switching said first current, said means having a conductive and nonconductive mode, means connected to said switching means and operatively associated with said second conductor for sensing said second current, means connected to said switching means for latching said switching means in one of said conductive and non-conductive modes, a voltage source connected to said latching means, said sensing means including a transformer having a center tapped seondary winding and a single turn primary winding operatively associated with said second conductor, said switching means including a first field effect transistor (FET) having a gate terminal, a drain terminal, and a source terminal, said gate terminal being connected to said transformer secondary terminal, said drain terminal connected to said latching means, said latching means including a second field effect transistor (FET) having a gate terminal, a drain terminal and a source terminal, said second FET gate terminal being connected to said first FET drain terminal, said latching means further including a capacitive member and a voltage limiting member operatively associated with said second FET, said latching means being electrically connected to said voltage source, wherein said capacitive member and said voltage limiting member are connected in parallel between the drain terminal and gate terminal of said second FET, said second mentioned source terminal being connected to a center terminal of said chance former secondary winding.

9. The device of claim 8 wherein said first FET begins conducting and causes said second FET to conduct, thereby said first FET and said second FET are mutually biasing to switch said device from said nonconductive mode to a conductive mode to establish said first current when said second current rising above a threshold level of said first FET.

* * * * *